(12) United States Patent
Williams

(10) Patent No.: US 11,180,668 B2
(45) Date of Patent: Nov. 23, 2021

(54) PRINTED CIRCUIT BOARD WITH INTEGRATED OPTICAL WAVEGUIDES

(71) Applicant: Vadient Optics, LLC, Beaverton, OR (US)

(72) Inventor: George Williams, Portland, OR (US)

(73) Assignee: VADIENT OPTICS, LLC, Beaverton, OR (US)

(*) Notice: Subject to any disclaimer, the term of this patent is extended or adjusted under 35 U.S.C. 154(b) by 0 days.

(21) Appl. No.: 16/507,658

(22) Filed: Jul. 10, 2019

(65) Prior Publication Data

US 2019/0330482 A1    Oct. 31, 2019

Related U.S. Application Data

(63) Continuation-in-part of application No. 16/224,512, filed on Dec. 18, 2018, which is a continuation of application No. 14/307,071, filed on Jun. 17, 2014, now Pat. No. 10,155,872.

(51) Int. Cl.

| | |
|---|---|
| *C09D 11/00* | (2014.01) |
| *C09D 11/322* | (2014.01) |
| *G02B 1/00* | (2006.01) |
| *C09D 11/52* | (2014.01) |
| *H01L 29/16* | (2006.01) |
| *B82Y 40/00* | (2011.01) |
| *B82Y 30/00* | (2011.01) |
| *B82Y 20/00* | (2011.01) |

(52) U.S. Cl.
CPC ............ *C09D 11/00* (2013.01); *C09D 11/322* (2013.01); *C09D 11/52* (2013.01); *G02B 1/002* (2013.01); *H01L 29/1606* (2013.01); *B82Y 20/00* (2013.01); *B82Y 30/00* (2013.01); *B82Y 40/00* (2013.01); *Y10T 428/24802* (2015.01); *Y10T 428/24917* (2015.01); *Y10T 428/24926* (2015.01)

(58) Field of Classification Search
CPC ....... G02F 1/0018; C09D 11/52; C09D 11/00; C09D 11/322; G02B 1/12; G02B 1/002; H01L 29/1606; Y10T 428/24802; Y10T 428/24917; Y10T 428/24926; B32Y 20/00; B32Y 30/00; B92Y 40/00
USPC ......................................................... 359/245
See application file for complete search history.

(56) References Cited

U.S. PATENT DOCUMENTS

2012/0305061 A1* 12/2012 O'Brien ................ H01L 31/056
                                                                    136/255
2015/0346580 A1* 12/2015 Williams .............. G02F 1/3526
                                                                    359/326

* cited by examiner

*Primary Examiner* — William K Cheung
(74) *Attorney, Agent, or Firm* — Alleman Hall Creasman & Tuttle LLP

(57) ABSTRACT

An apparatus with integrated optical waveguides. The apparatus has: a plurality of layers, wherein a conductive pathway is patterned on a surface of at least one of the plurality of layers. The plurality of layers are laminated together. A plurality of nanocomposite-inks, each with a nanofiller dispersed in an organic matrix have optical dispersion different from the other plurality of nanocomposite-ink, form the optical waveguides. The optical waveguides are formed on the surface of, or within, at least one of the plurality of layers.

20 Claims, 14 Drawing Sheets

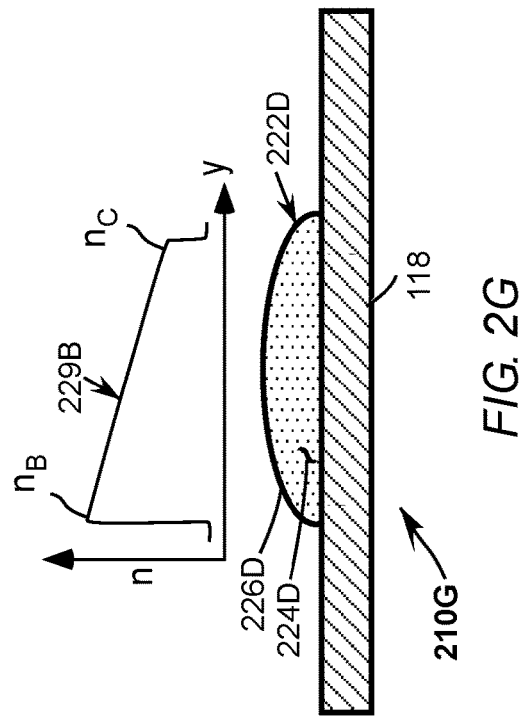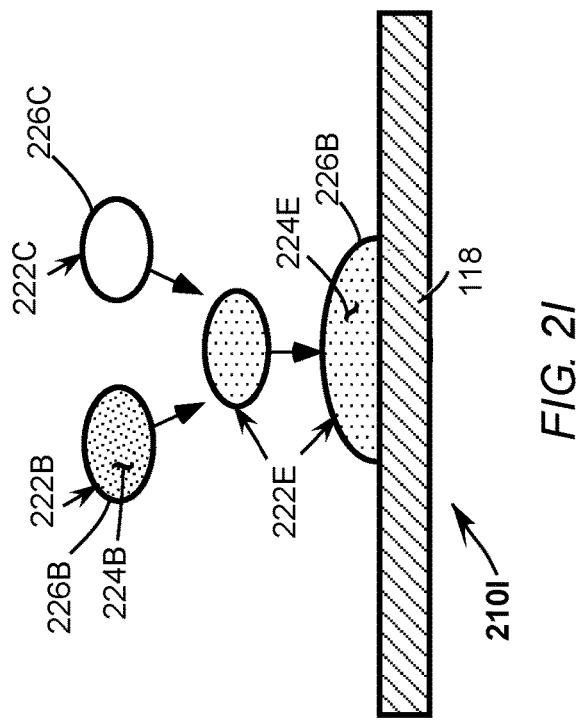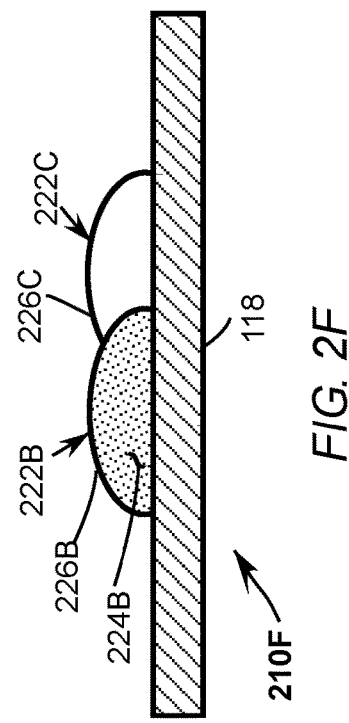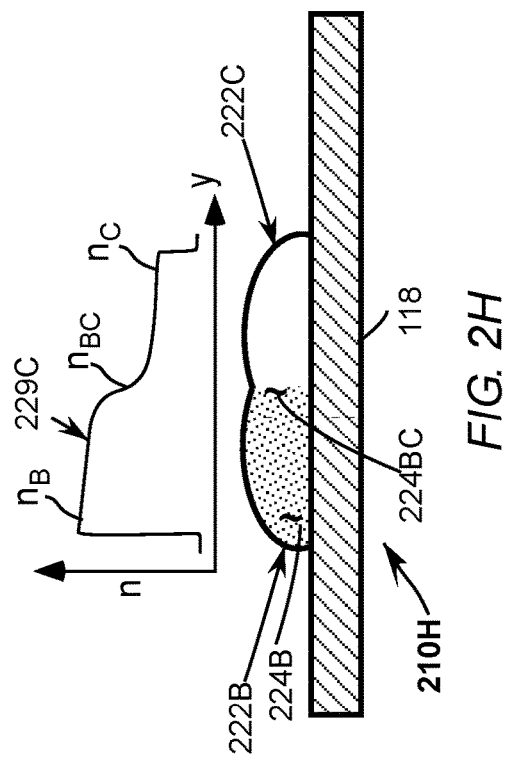

PRINTED CIRCUIT BOARD WITH INTEGRATED OPTICAL WAVEGUIDES

REFERENCE TO RELATED APPLICATIONS

This application is a continuation-in-part of U.S. patent application Ser. No. 16/224,512, filed on Dec. 18, 2018, which is a continuation of U.S. patent application Ser. No. 14/307,071, filed on Jun. 17, 2014, now U.S. Pat. No. 10,155,872.

STATEMENT OF GOVERNMENT INTEREST

Not applicable.

TECHNICAL FIELD OF THE INVENTION

The present invention relates in general to manufacture of printed circuit boards (PCB). The invention relates in particular to manufacture of PCBs with integrated optical components such as optical waveguides, lenses, mirrors, detectors and transmitters by using nanocomposite-ink and additive manufacturing processes, such as may used in photonic detectors and transceivers.

DISCUSSION OF BACKGROUND

A printed circuit board PCB is formed from many layers, each of the layers has an electrically insulated substrate with a conductive pathway patterned on one or both surfaces of the layers. During manufacture additive or subtractive etching processes are used to pattern the conductive pathways on the layer surfaces. The layers are laminated together, typically with a resin impregnated fiberglass mesh, binding and insulating the layers. Through-holes or blind-holes are made by mechanically milling or laser drilling before or after lamination to allow electrical interconnection between surfaces and layers. The finished PCB board typically has exposed pads, blind-holes, and through-holes to connect electrical components, electrical connectors, and adapters on one or both sides.

Increased data transmission in high speed networks require updated network infrastructure with hybridized printed circuit boards that include both conductive and optical waveguides that enable electronic devices to integrate with photonic devices. Replacing electrical data transmission lines with optical transmission lines increases bandwidth and data rate overcoming data transmission limitations in pure electrical systems. Printed circuit boards with optical functionality are referred to as hybridized printed circuit boards, electro-optic printed circuit boards (EOPCB), and optical printed circuit boards (OPCB). Manufacturing such printed circuit boards with optical functionality has been challenging due to a variety of factors which include compatibility issues with current PCB manufacturing technology, difficulty in waveguide integration due to variation in surface topology on PCB layers, and difficulty creating robust interconnecting waveguides on layers, within layers, and through layers. Additionally, optical coupling connectors, adapters, and like receptacles are difficult to integrate.

In the art a multitude of photolithography techniques have been proposed to create waveguides, but photolithography generally require complex processes that increase manufacturing time. U.S. Pat. No. 7,583,880 involves applying a dry film to a printed circuit board, forming a cladding layer on the dry-film, then forming a core layer, creating waveguide cores by patterning the core layers, then forming a top cladding layer. Similarly, U.S. Patent Publication 20060133756 involves applying a dry-film and liquid coating to form waveguides on a printed circuit board. U.S. Patent Application No. 20090041409 involves mechanically milling a trench, smoothing the trench with a metal coating, then inkjet printing a cladding and core within the trench.

This application relates to another approach.

SUMMARY OF THE INVENTION

Disclosed hereinbelow is an apparatus with conductive pathways and integrated optical waveguides. The apparatus has a plurality of layers with a conductive pathway patterned on a surface of at least one of the plurality of layers. The plurality of layers is laminated together. The integrated optical waveguide further includes a plurality of cured nanocomposite-inks, the plurality of cured nanocomposite-inks comprising a nanofiller dispersed in an organic matrix, each of the plurality of nanocomposite-inks having optical dispersion different from the other nanocomposite-inks. The apparatus has an optical waveguide, the optical waveguide formed on the surface of, or within, at least one of the plurality of layers, the nanocomposite-ink forming the optical waveguide. The apparatus further includes an optical component, the optical component on the surface of, or within, at least one of the plurality of layers, the nanocomposite-ink forming the optical component, wherein the optical component has, at least in part, a gradient refractive profile.

BRIEF DESCRIPTION OF THE DRAWINGS

The accompanying drawings, which are incorporated in and constitute a part of the specification, illustrate preferred methods and embodiments of the present invention.

The drawings together with the general description given above and the detailed description of preferred methods and embodiments given below, serve to explain principles of the present invention.

FIG. 2F is a cross-section view, schematically illustrating deposition of the nanocomposite-ink side-by-side.

FIG. 2G is a cross-section view, schematically illustrating that shown in FIG. 2F, where nanocomposite-ink mixing resulted in a slow transition in the refractive-gradient profile.

FIG. 2H is a cross-section view, schematically illustrating that shown in FIG. 2F, where nanocomposite-ink mixing resulted in a fast transition in the refractive-gradient profile.

FIG. 2I is a cross-section view, schematically illustrating mixing of nanocomposite-inks in air.

DETAILED DESCRIPTION OF THE INVENTION

Figure 1:
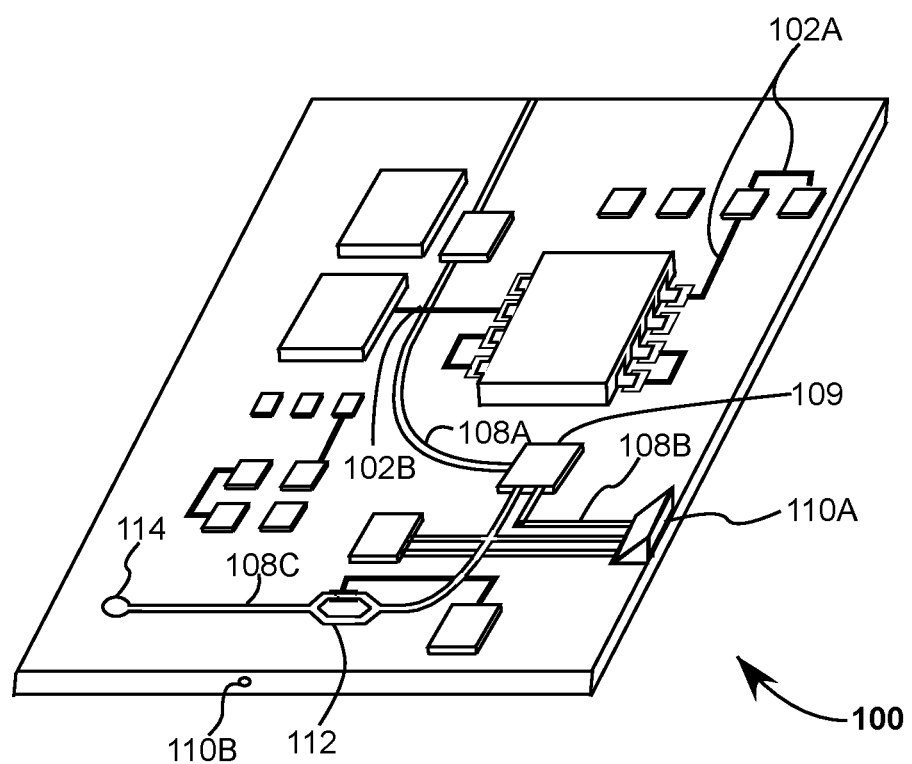
FIG. 1 is a perspective view of a printed circuit board (PCB) comprising a plurality of layers, wherein conductive pathways are patterned on the layer surfaces, and further comprising a plurality of nanocomposite-inks, the nanocomposite-inks comprising a nanofiller dispersed in an organic matrix, each of the plurality of nanocomposite-inks having optical dispersion different from the other nanocomposite-inks, an optical waveguide, the optical waveguide formed on the surface of, or within, at least one of the plurality of layers, the nanocomposite-ink forming the optical waveguide, and an optical component, the optical component on the surface of, or within, at least one of the plurality of layers, the nanocomposite-ink forming the optical component, wherein the optical component has, at least in part, a gradient refractive profile.

Referring now to the drawings, wherein like components are designated by like reference numerals. Methods and embodiments of the present invention are described further hereinbelow.

Referring to FIG. 1, wherein a perspective view of a printed circuit board (PCB) 100 with optical functionality is shown. PCB 100 has a plurality of layers, wherein conductive pathways, such as a conductive pathway 102A and 102B, are patterned on a surface of at least one of the plurality of layers, the plurality of layers laminated together. Conductive paths are typically copper. Conductive pathway 102A and 102B are on an exposed layer surface with a variety of electrical components, including resistors, capacitors, amplifiers, integrated circuits and like electrical components soldered onto exposed pads. In some examples, the conductive pathways are made, or supplemented with conductive nanocomposite-ink, which is processed to form a conductive solid. PCB 100 has a plurality of nanocomposite-inks, the nanocomposite-inks comprising a nanofiller dispersed in an organic-matrix, each of the plurality of nano-composite-inks having optical dispersion different from the other nanocomposite-inks. PCB 100 has an optical waveguide 108A, optical waveguide 108A formed on the surface of, or within, at least one of the plurality of layers, the optical waveguide is from the nanocomposite-ink. PCB 100 further has an optical component, the optical component on the surface of, or within, at least one of the plurality of layers, the nanocomposite-ink forming the optical component, wherein the optical component has, at least in part, a gradient refractive-index profile.

Optical PCB 100 is exemplary for describing various possible configurations and examples of nonlimiting layout options in accordance with the present invention. PCB 100 allows both electrical and optical functionality, delivering optical signals on and off the board, without the need of electrical conversion. The optical PCB receives, routes and transmits optical signals generated both on-board and off-board including optical interconnects to on-board components, board-to-cable, and board-to-board connection. For instance, the waveguides can couple light from on-board photonic sources, nonlimiting examples of such board mountable sources include light emitting diodes (LEDs), edge-emitting, surface emitting laser diodes and all their variations. The waveguide can also couple into on-board detector components such as photodiodes including silicon (Si), germanium (Ge), Indium gallium arsenide (InGaAs) based photodetectors.

By way of example PCB board 100 has an optical interconnect 110A connected to a waveguide array 108B. The individual optical waveguides route optical signals to various electrical components and optical components on the board. For instance, optical interconnect 110A allows board-to-board pluggable, fiber optic cable connection, or air-launch connections. Additionally, the optical interconnection be located within the PCB area or on the perimeter, launching from within either an embedded laminated layer or on the exposed surfaces of the laminated layers. Waveguide 108B has a 90 degree total-internal-reflection (TIR) surface that redirects light and couples into an optical router 109. Optical router 109 has an output waveguide 108A which travels in a radius, the radius smaller than the bend radius to prevent optical loss. Waveguide 108A crosses conductive pathway 102B. Waveguide 108A can be manufactured over the top of the conductive pathway or alternatively the patterned conductive pathways can terminate on either side of the designed path of the waveguide and be electrically connected with the conductive-ink after deposition of the waveguide as will be explained in detail further hereinbelow.

Optical router 109 has output waveguide 108C. Waveguide 108C intersects with other waveguides before coupling into an electro-optic modulator (EO-modulator) 112. The intersection of the waveguide can be manufactured co-planar with the waveguide cores connected in a crossed configuration and described in detail further hereinbelow. Alternatively, the waveguides can be manufactured such that one of the waveguides passes over the top of the other waveguide. After EO-modulator 112, a waveguide 108C leads to an optical interconnect 114. Optical interconnect 114 allows for the waveguide to couple to other layers in the PCB or alternatively air-launch the optical signal on either side of the PCB.

The waveguide and the optical components are made, at least in part, from the nanocomposite-ink. The nanocomposite-ink is a composite mixture of a nanofillers dispersed within an organic-matrix. The type of organic-matrix, combined with the type, size, and concentration of the nanofillers determine the material properties of the nanocomposite-ink. The nanocomposite-ink is preferably deposited using inkjet printing technology, although other additive manufacturing process and patterning techniques can be used or complement deposition.

The organic-matrix is optically clear, curable resin. Four non-limiting examples of printable organic-matrix material for the dielectric layers are polyacrylate, hexanediol diacrylate (HDODA), polymethyl methacrylate (PMMA), diethylene glycol diacrylate (DEGDA) and SU-8. The nanofillers are nanoparticles either chemically bonded or otherwise dispersed within the organic-matrix. Non-limiting examples of nanofillers include beryllium oxide (BeO), aluminum nitride (AlO), silicon carbide (SiC), zinc oxide (ZnO), zinc sulfide (ZnS), zirconium oxide (ZrO), yttrium orthovanadate (YVO4), titanium oxide (TiO2), copper sulfide (CuS2), cadmium selenide (CdSe), lead sulfide (PbS), molybdenum disulfide (MoS2) and silicon dioxide (SiO2), including those with core, core-shell, and core-shell-ligand architectures.

The size of the individual nanoparticles is on the order of about nanometers, typically less than about 5 nanometers (nm), although the size can be orders of magnitude larger. When the nanocomposite-ink is used as an optical medium the nanoparticles are sized sufficiently small with respect to light wavelengths, for those wavelengths intended for use, not to scatter the light. The nanocomposite-ink material properties is based on, and can be changed by modifying, the organic-matrix type, the nanofiller type or types, the nanofiller architecture, the loading concentration of nanofillers, and combinations thereof.

The nanocomposite-ink can be tuned by the organic-host type, nanofiller type, and the concentration of the nanofillers in the organic-matrix. When tuning the refractive-index of the nanocomposite-ink the refractive-index can be approximated by the summation by percent volume of the optical properties of the organic-host and the nanofillers. Loading by volume of the nanoparticles to the organic-host can be about 0.25% to about 70% volume, depending on the desired change in properties.

While the nanocomposite-ink can be deposited by a variety of additive processes, inkjet printing is one preferred deposition technique. The nanocomposite-ink is preferably inkjet printable with viscosity about 1 to about 15 centipoise (cP). Using piezo driven inkjet printing heads droplets can be deposited in volumes of about 1 to about 15 picoliter, providing droplets disk diameters on the order of about 10 to about 25 microns, depending on wettability of the underlying material.

The nanocomposite-inks used for the optical waveguide or optical component preferably have high optical transmission for those wavelengths used in optical telecommunications. Spectral ranges compatible with the present invention include the visible, near-infrared, and shortwave infrared, including so-called "eyesafe" regions. In particular, fiber optic communication for short and long transmission uses standardized communication bands grouped in spectral ranges from about 800 nm to about 2100 nm.

The conductive pathways can be formed using traditional PCB manufacturing processes. In addition, the conductive pathways can be made from, or supplemented with the aforementioned conductive nanocomposite-ink. The conductive nanocomposite-ink is preferably ink-jet printable. The conductive nanocomposite-inks can be deposited concurrently or after deposition of the nanocomposite-inks used for optical purposes. Concurrent deposition allows for complex 3-dimensional configurations of the conductive-inks. The deposition of the optical nanocomposite-ink can be directly onto smooth surfaces of the optical-device or in structured surfaces. For instance, the optical nanocomposite-ink can be deposited forming a structure or channel, then partially cured to allow for guided deposition of the conductive-ink without mixture of the two inks. Alternatively, UV lithography techniques, nanoimprinting, single point CNC, or fluid jet polishing can be used to form channels.

Two suitable types of electrically conductive-inks are metal-based and graphene-based. The metal-based conductive-inks include metalorganic decomposition ink (MOD-ink) and more generally, aqueous based conductive nanocomposite-ink. Of the metal-based conductive-inks, the aqueous based conductive-inks are the preferred. MOD-inks are solvent based inks with metallic salts such as silver salt. However, the preferred aqueous based nanocomposite-inks endows a variety of advantages over conventional MOD-ink based on organic solvents in printing narrow conductive patterns without irregular morphologies and without residual contaminants. The aqueous based metal nanocomposite-inks are suspensions of metal nanoparticles such as silver and copper. The aqueous-based nanocomposite-inks are commercially available at a variety of manufacturers, for example, silver based nanocomposite-inks are available at Novacentrix in Austin, Tex. in The United States, Cabot Corporation in Boston, Mass. in The United States, and Samsung ElectroMechanics in Suwon, Gyeongg-do in South Korea.

The metal-based conductive-ink requires treatment, usually a sintering process, in order to create continuous connectivity of the conductive nanoparticles. The sintering process can include implementation of a furnace to increase the temperature of the conductive-ink, but temperatures of the optical-device should be kept below the glass transition of the polymers. Preferably the temperature of the EO-modulator is kept below 150° Celsius (C). A number of techniques can be implemented to avoid high temperatures while allowing continuous connectivity of the conductive nanoparticles. Hydrochlorides solutions can be used to dissolve chemical coating on the nanoparticles. Direct localized heating of the conductive-inks can be achieved through direct resistive heating. Pulsed light can sinter the material via pulsed ultraviolet xenon arc lamps, near infrared, or other radiation sources.

The graphene-based nanocomposite-ink are suspensions of graphene, graphene-oxide, or other graphite-based particles. A typical procedure for preparing non-oxidized graphene-based conductive-ink is to grind natural graphite flakes into smaller particles, approximately 5 microns of less, then disperse in deionized water with or without a dispersing agent and with or without sonication. One example of a deionized water with a dispersing agent is Deionized water with 0.1% by weight of dispersing agent, Zonyl® FSO surfactant can be used to obtain a suspension of graphene flakes. Zonyl® FSO is available from DuPont, headquartered in Wilmington, Del. of the United States. Sonication aids in dispersing the graphite in the solution and reducing aggregation.

Another graphene-based (or graphite-oxide) nanocomposite-ink are suspensions of graphene-oxide flakes. Graphene-oxide can be obtained by oxidation of graphite using strong oxidizing agents. For example, graphite flakes can be oxidized with sulfuric acid, nitrate, and potassium permanganate or with potassium chlorate and nitric acid, known as the Hummers and Brodie methods respectively. Oxygenated functionalization causes the graphene-oxide to have increased layer separation and make the material hydrophilic. Using sonication the graphene-oxide can be dispersed in water. Treatment of the graphene-oxide dispersion results in the conductive layers of graphene. Methods of treating the graphene-oxide solution includes treatment with hydrazine hydrate at 100 degrees Celsius for 24 hours, exposing the dispersion to hydrogen plasma for a few second, Joule heating by applying current to the conductive-inks, or by irradiating the dispersion with a strong pulse of light. Light of wavelengths in the ultraviolet, near-infrared, infrared, and microwave can be used. For treatment within the optical-device, light radiation from a laser can irradiate the conductive-inks either collectively with a large beam or selectively with a focused beam.

During treatment of the graphene-oxide, most carboxyl, hydroxyl and epoxide groups are removed from the graphene-oxide, resulting in conductive graphene. During this process gases, for example CO and CO2 are formed. For those conductive-inks that are encapsulated in the nanocomposite, voids can be made into the optical-device allowing escape of gases during treatment.

Yet another of the conductive-inks are carbon nanotube (CNT) based inks. CNT-based ink are prepared with a conductive polymer such as poly(3,4-ethylenedioxythiophene)-poly(styrene sulfonate) (PEDOT-PSS) and carboxyl functionalized single-walled carbon nanotubes (SWCNT-COOHs).

Graphene, graphene-oxide, and other graphene based products are commercially available at a variety of manufacturers. For example, graphene products are available from; Graphene Supermarket in Calverton, N.Y. of the United States, ACS Material of Medford, Mass. of the United States, and Grafen Chemical Industries Co. of Ankara, Turkey.

For those configurations of the optical-device in which a conductive path is required for external communication, a metal-metal contact, pad, or interface can be made as is well known in the art. For the carbon-based conductive-inks a metal-graphene interface can be made. Some nonlimiting examples of wetting metals that allow for low resistance contact are Nickel, Titanium (Ti) and Palladium (Pd). One process that allows lower resistance is through metal-catalyzed etching in hydrogen, nano-sized pits in the graphene can be created, then the graphene can be metalized with one of the above materials, the deposited metals forming bonds with the zigzagged edges around the pits.

High loading of thermally conductive nanoparticles, such as aluminum nitride, or other ceramics and metal-oxides nanoparticles allow for thermally conductive, yet electrically insulated conductive-inks. Such inks can be used as heat sinks and thermal connection to components within the optical-device.

Figure 2A:
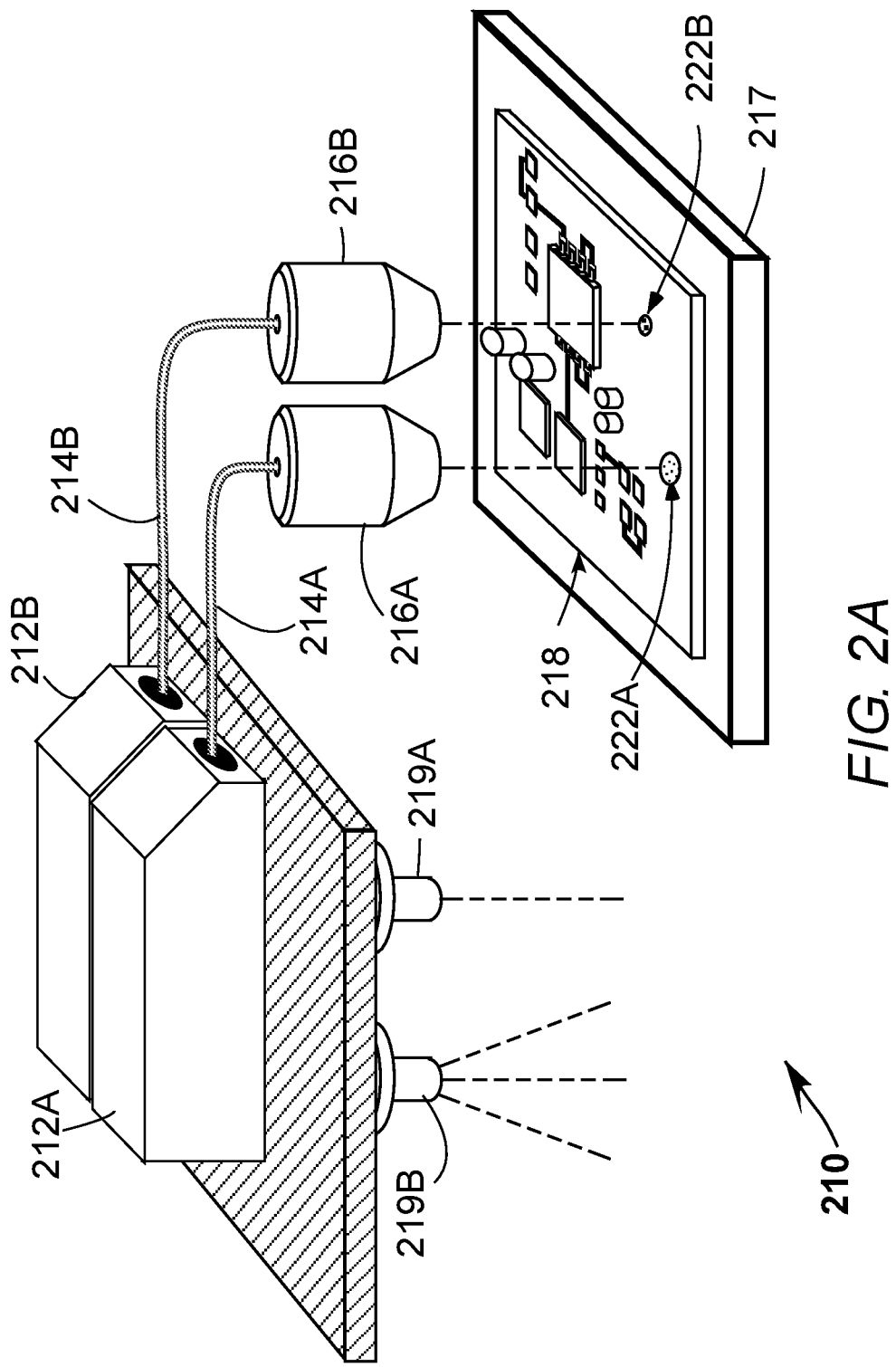
FIG. 2A is a perspective view of an inkjet printer for depositing nanocomposite-ink.

Referring to FIG. 2A, a perspective view of an ink-jet printing apparatus 210 for deposition of the optical or conductive nanocomposite-ink is shown in accordance with the present disclosure. Printing apparatus 210 is simplified for explanatory purposes. Printing apparatus 210 has a reservoir 212A and 212B that hold a nanocomposite-ink 222A and 222B, respectively. Reservoir 212A and 212B provide a printing-head 216A and 216B with a nanocomposite-ink 222A and 222B via feed-lines 214A and 214B, respectively. Printing-heads 216A and 216B deposit nanocomposite-ink 222A and 222B, on a PCB layer 218 at a voxel, thereby forming a nanocomposite structure, such as the optical waveguide. The term voxel refers to a position in three-dimensional space. The printing-heads are illustrated with a single nozzle but in practice the print-heads can and preferably have a plurality of nozzles, the nozzles able to asynchronously deposit the nanocomposite-ink. A stage 217 positions PCB 218, with respect to the printing-heads, for deposition of the nanocomposite-inks at particular voxels.

After deposition of the nanocomposite-ink from one of the printing-heads, substrate 218 can be positioned with respect to radiation source 219A for selective-curing of the nanocomposite-ink, at voxels. Selective-curing refers to localized radiation about voxels, activating the organic-host matrix. Activation of the organic-host matrix solidifies the nanocomposite-ink. Selective-curing means zero-curing, partial-curing, or fully-curing, which respectively means not solidifying, partially solidifying, or fully solidifying the nanocomposite-ink. Another radiation source 219B flood cures the nanocomposite-ink on the PCB. Flood curing is desirable when the all the nanocomposite-ink needs to be partially or fully cured.

A variety of process related parameters must be considered and controlled during deposition of the nanocomposite-ink. For instance, non-limiting process parameters for inkjet printing the nanocomposite-ink include nozzle temperature, substrate temperature, ambient temperature, droplet viscosity, droplet size, droplet velocity, droplet settle time, boundary conditions between adjacent droplets, deposition frequency, deposition pattern, deposition angle, deposition accuracy, deposition repeatability, cure mechanisms required, cure exposure time, material shrinkage or expansion, substrate or underlying material wettability, material deposition order, and deposition pattern. In order to achieve a gradient in material properties, the nanocomposite-ink material properties must change either as fed to the print-heads or by localized mixture and diffusion of nanoparticles of adjacent deposited droplets.

Figure 2B:
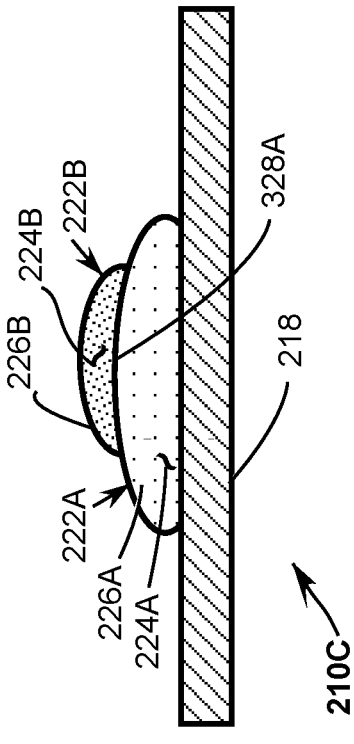
FIG. 2B is a cross-section view, schematically illustrating nanocomposite-ink deposited on a surface.

Referring now to FIG. 2B through FIG. 2I, further details of the deposition of the nanocomposite-ink is illustrated. In FIG. 2B, nanocomposite-ink 222A is deposited on PCB 218, the droplet is bound by a nanocomposite-air interface 226A. The nanocomposite-ink consists of the organic-matrix with a nanofiller 224A dispersed throughout the organic-matrix.

Figure 2C:
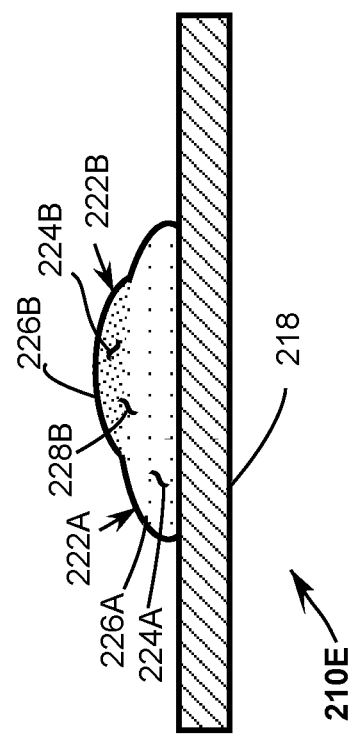
FIG. 2C is a cross-section view, schematically illustrating an additional deposit of nanocomposite-ink.

FIG. 2C illustrates a nanocomposite structure 210B which has the nanocomposite-ink as that shown in FIG. 2B with an additional deposit of nanocomposite-ink 222B at a voxel above the voxel of nanocomposite-ink 222A. Here, nanocomposite-ink 222B is shown after deposition, characterized by a dispersed nanofiller 226B, an ink-ink interface 228A, where mixing between nanoparticle-inks has not yet occurred, and air-ink interface 226B.

Figure 2D:
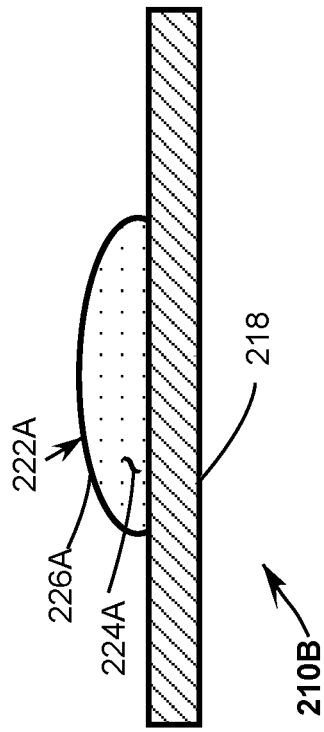
FIG. 2D is a cross-section view, schematically illustrating the resultant nanocomposite from the diffusion or convective mixing of nanofillers from the first and the second nanocomposite-ink as shown in FIG. 2C.

FIG. 2D illustrates a nanocomposite structure 210C, similar to that shown in FIG. 2C, wherein the selective-curing of nanocomposite-ink 222A before deposition of nanocomposite-ink 222B allowed full diffusion. A nanocomposite-ink 230 is the resultant mixture of uncured nanocomposite 222A and 222B. Nanocomposite-ink 230 is characterized by an air-ink interface 232 and nanofillers 224A and 224B dispersed within. A refractive-gradient between the top and bottom of nanocomposite-ink 230 depends on convective mixing resulting from relative size, velocities, and nanofiller concentrations between the nanocomposite-inks, any partial-curing of nanocomposite-ink 222A before deposition of nanocomposite-ink 222B, the temperature of the substrate, and time allowed for diffusion of nanofillers from nanocomposite-inks 222A and 222B, before additional partial-curing of the nanocomposite-inks.

Figure 2E:
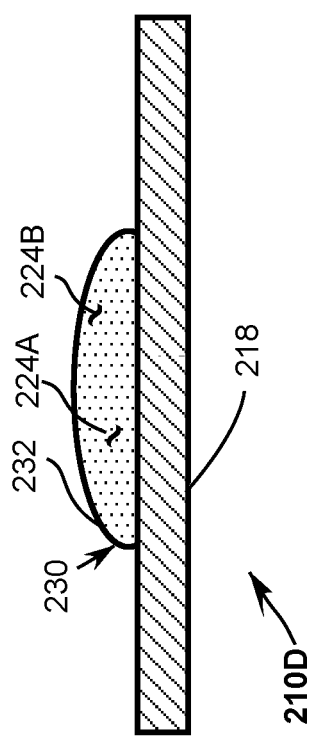
FIG. 2E is a cross-section view, schematically illustrating a resultant refractive-gradient between the first nanocomposite-ink and second nanocomposite-ink from diffusion of nanofillers of the first and second nanocomposite-inks, where the first nanocomposite was partially cured before deposition of the second nanocomposite-ink.

FIG. 2E illustrates a nanocomposite structure 210E similar to that shown in FIG. 2C, wherein nanocomposite 222A was partially-cured. Here, partial-cure of nanocomposite 222A results in gradient-area 222B between nanocomposite 222A and 222B. The extent of a gradient-area 222B depends on the selective-cure of nanocomposite-ink 222A. For instance, a small amount of exposure with gel the nanocomposite-ink, decreasing the diffusion rate. In addition to controlling gradient-areas, partial-curing before subsequent deposition reduces stress and strain in the resultant optical-element.

FIG. 2F illustrates a nanocomposite structure 210F, similar to that shown in FIG. 2B wherein the nanocomposite-ink is deposited side-by-side. Here, nanocomposite-ink 222B hash nanofillers 224B and ink-air interface 226B is deposited along the side of nanocomposite-ink 222C. Nanocomposite-ink 222C has no nanofillers and bound by air-interface 226C.

FIG. 2G illustrates the nanocomposite structure 210G, similar to that shown in FIG. 2F, except nanocomposite-ink 222B has mixed with nanocomposite 222C resulting in a gradient nanocomposite 222D. Here nanocomposite 222D is bounded by an ink-air interface 226D, has nanofillers 224D, the same nanofillers as nanocomposite-ink 222B, distributed by diffusion, forming a refractive-gradient profile 229B. The gradient is a result of mixture of the nanocomposites where the partial-curing of nanocomposite 222B was minimal and aforementioned convective mixing and time was allowed before further partial-curing. Refractive-gradient profile 229B is characterized by a high refractive-index nB, the high refractive-index due to higher concentration of nanoparticles 224D, the refractive-gradient's refractive-index slowly and smoothly transitioning in the y-direction to a low refractive-index nC, the low refractive-index due to the low concentration of nanoparticles 224D.

FIG. 2H illustrates nanocomposite structure 210H, similar to that shown in FIG. 2F, wherein nanocomposite-ink 222B has been partially-cured before deposition of nanocomposite-ink 222C. Here partial-cure of nanocomposite-ink 222B, results in limited mixing of nanocomposite-ink 222C at interface 224AB, resulting in refractive-gradient profile 229C. Refractive-gradient profile 229C is characterized by high refractive-index nB, the high refractive-index due to higher concentration of nanoparticles 224D, the refractive-gradient's refractive-index unchanging in the y-direction until quickly transitioning to low refractive index nB at former interface 224AB. Alternatively, refractive-gradient profile 229C could be produced without partial-curing of nanocomposite-ink 222B, before deposition of nanocomposite 222C, by limiting the aforementioned mixing factors, such as controlling nanocomposite-ink deposition velocities, and limiting diffusion by temperature control of the substrate, and curing the deposited nanocomposite-inks within controlled time periods.

FIG. 2I illustrates nanocomposite-ink structure 210I, illustrating another mixing method of the nanocomposite-ink. Nanocomposite-ink 226B and nanocomposite-ink 226C are deposited such that the respective printing heads are aligned such that the nanocomposite-ink mix in air creating nanocomposite-ink 222E. Nanocomposite-ink 222E, then deposits, mixed, onto substrate 118 with nanofillers 224E bounded by ink-air interface 226B.

Figure 3A:
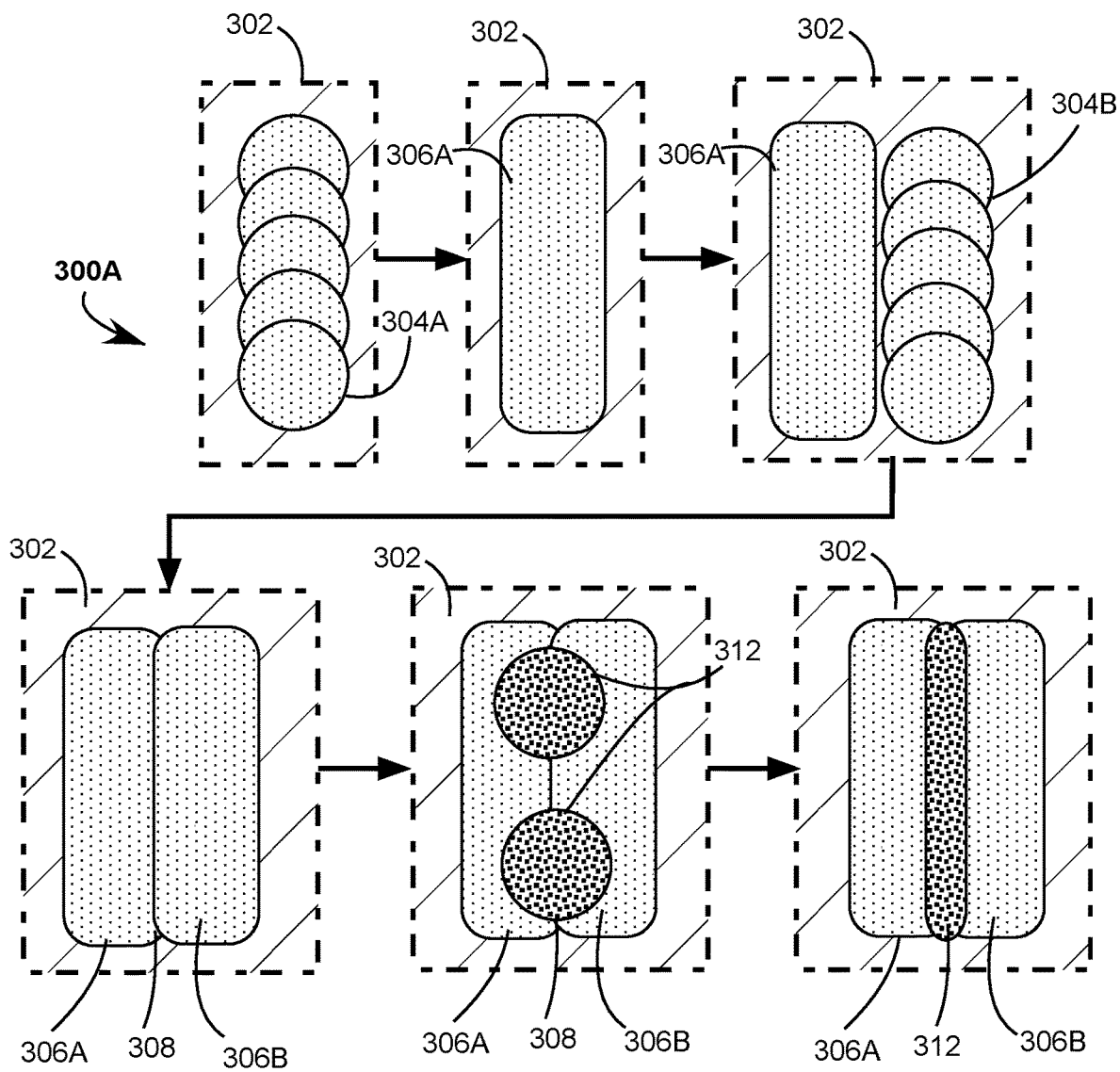
FIG. 3A is a flow diagram 300A illustrating plan-view deposition steps to form an optical waveguide.

FIG. 3A is flow diagram 300A illustrating plan-view deposition steps to form an optical waveguide. First series of nanocomposite-ink droplets 304A are deposited on PCB layer 302, such that each droplet overlaps the precedent droplet. Droplets 304A are allowed to intermix creating a continuous strip 306A of nanocomposite-ink with continuous smooth sidewalls. The slope of the sidewalls defined by the viscosity of the nanocomposite-ink, the wettability of the substrate, and partial curing. Second series of nanocomposite-ink droplets 304B is deposited in parallel with and in proximity to continuous strip 306A. Similar to the first series, the second series of nanocomposite-ink droplets form continuous strip 306B with continuous smooth sidewalls. Continuous strip 306A and 306B, in physical contact, form valley 308, the valley defined by the sidewalls from the continuous strips. Nanocomposite-ink droplets 312 are deposited within valley 308, the nanocomposite-ink with a refractive index higher than that of the previously deposited nanocomposite-inks forming the continuous strips. Here, droplets 312 are spaced sufficiently apart such that the volume of the valley is filled, with negligible overfill, although excess deposition could be removed by, for instance, a sweeping doctor blade. Capillary action, driven by surface tensions and adhesive forces fills the valley sufficiently to create core 304C. Last, the core is capped with nanocomposite-ink, creating a continuous cladding layer.

Figure 3B:
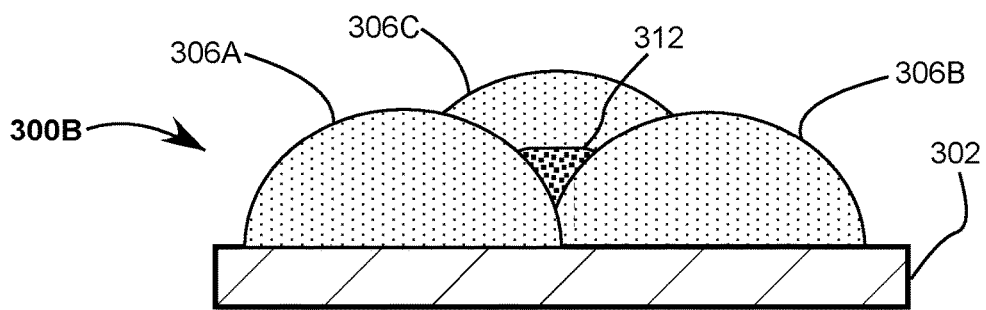
FIG. 3B is a cross-section view of the optical waveguide 300B as made by the process shown in FIG. 3A.

FIG. 3B is a cross-section view of the optical waveguide 300B as made by the process shown in FIG. 3A. Core 312 is nanocomposite-ink with refractive-index greater than the refractive index of the surrounding cladding for the transmission wavelength. The core is bound by the continuous sidewalls of continuous nanocomposite strips 306A, strip 306B, and capping layer 306C. The size of the core, geometry of the core, the refractive-index of the core, and the refractive index of the cladding determines the allowed transverse modes as is well known in the art. The waveguide can be manufactured with strict core cladding interfaces or alternatively can be manufactured with a gradient refractive index core cross-section. Likewise along the length of the optical waveguide the core and cladding optical properties can be adjusted.

Figure 4:
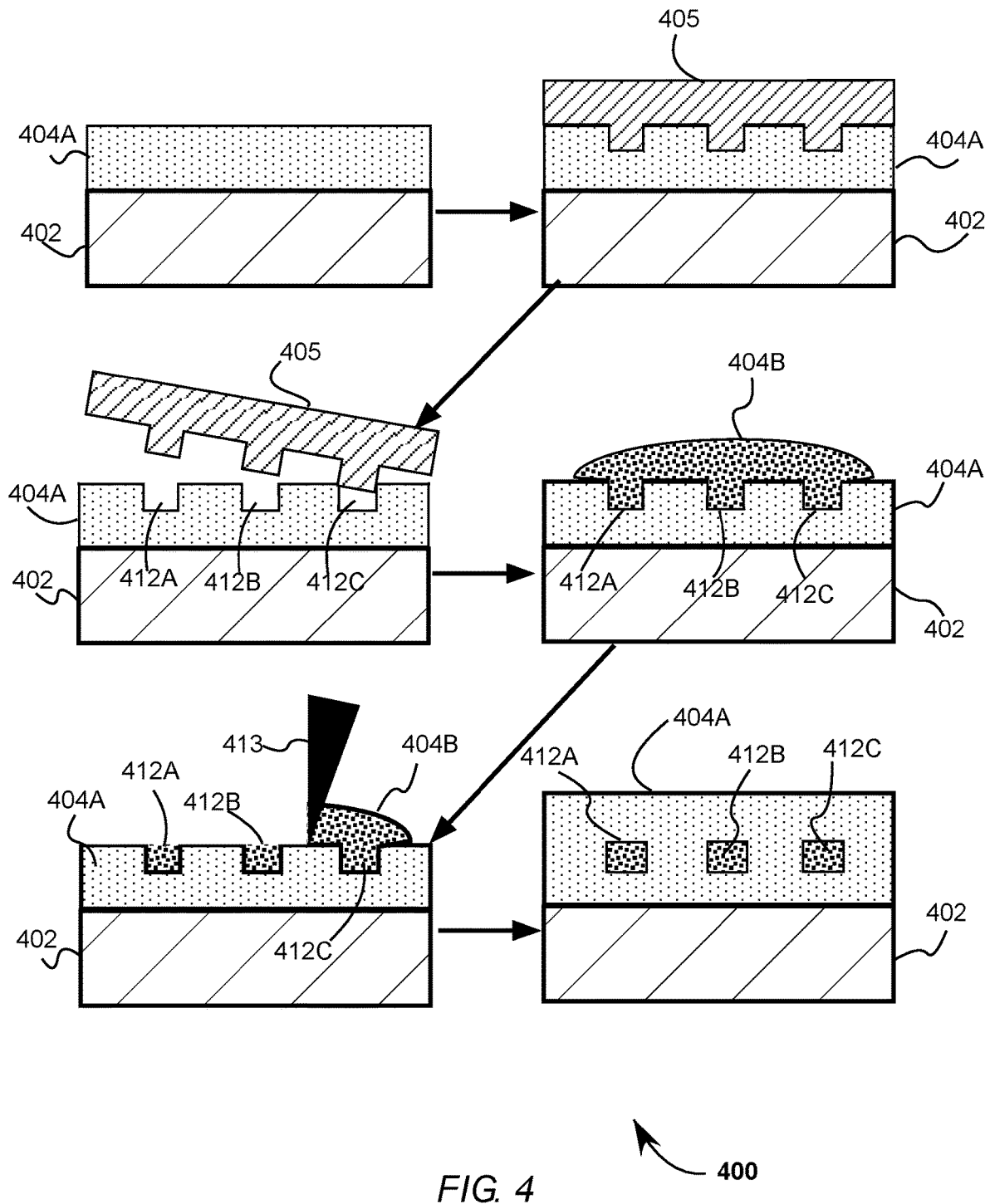
FIG. 4 is a flow diagram illustrating a method of manufacturing an optical waveguide.

FIG. 4 is a flow diagram illustration 400 providing a method of manufacturing an optical waveguide via nano-imprinting and inkjet printing. To manufacture well defined core or any array of tightly spaced waveguide cores, nano-imprinting techniques can be implemented. First, a layer of nanocomposite-ink 404A is deposited on a PCB layer 402. The nanocomposite-ink layer is gelled via curing mechanisms. A nanoimprint stamp 405 pressed into the gelled nanocomposite-ink layer. The gelled nanocomposite-ink layer is then cured, and nanoimprint stamp 405 removed, leaving the negative of the patterned stamp. Alternatively, the layer can be partially-cured so that the nanocomposite-ink is sufficiently gelled such that the negative imprint remains after stamp removal, and then cured. Another method includes heating the nanoimprint stamp above slightly above the nanocomposite-ink glass transition temperature and hot pressing the nanoimprint stamp. Here, the imprint defines three rectangular waveguide cores 412A, 412B, and 412C. The waveguide cores are then filled, for instance with inkjet deposition, with nanocomposite-ink 404B. The excess nanocomposite-ink is removed with doctor blade 413 and the waveguides capped with additional deposition of nanocomposite-ink 404A.

Figure 5A:
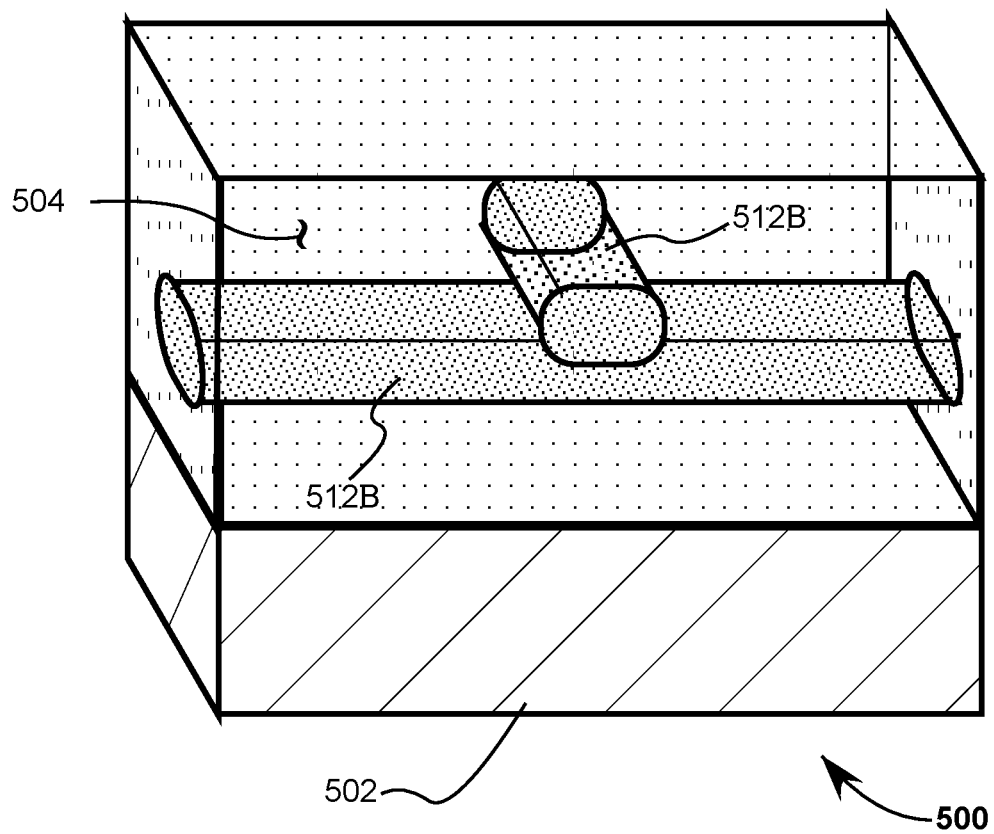
FIG. 5A is a perspective view illustrating crossing waveguides.
Figure 5B:
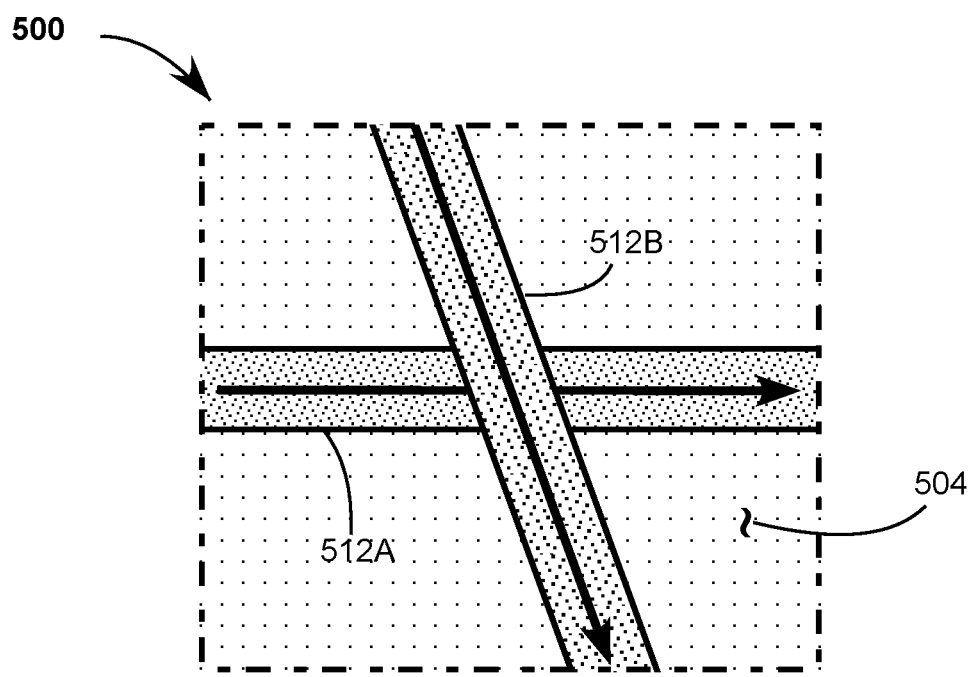
FIG. 5B is a plan view illustrating that shown in FIG. 5A.

FIG. 5A is a perspective view and FIG. 5B is a plan view illustrating crossing waveguides 500, wherein the optical waveguides are built in consecutive layers. Here, first optical waveguide core 512A, surrounded by cladding 504, is manufactured first, using aforementioned waveguide manufacturing techniques, then an additional layer of cladding nanocomposite-ink is deposited to allow manufacture of the optical waveguide core 512B. Optical waveguide core 512B passes over the first optical waveguide without need of intersecting waveguides, allowing virtually and crossover angle and avoiding crosstalk of optical signals.

Figure 6A:
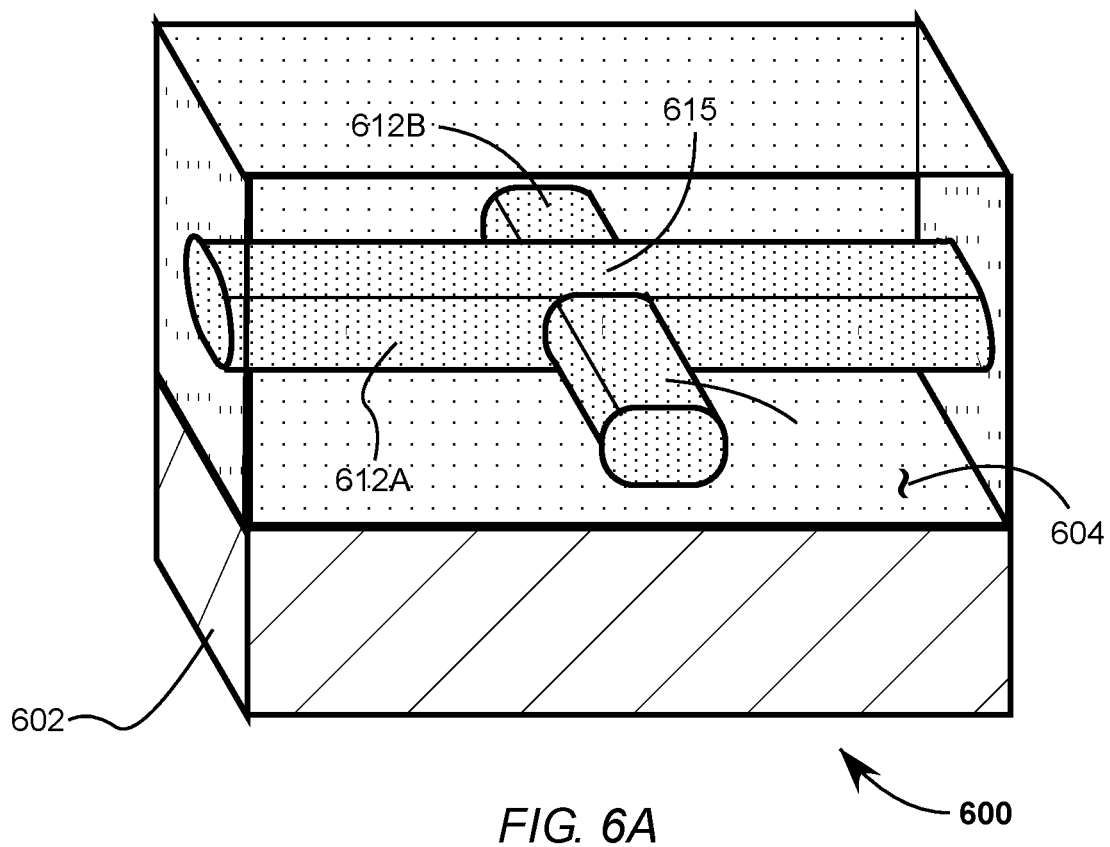
FIG. 6A is a perspective view of intersecting waveguides.
Figure 6B:
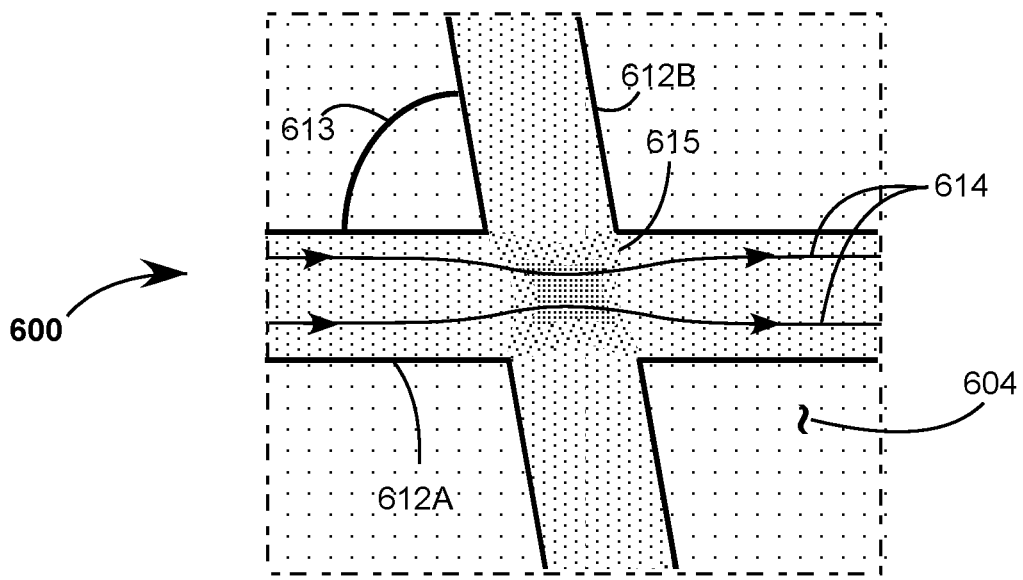
FIG. 6B is a plan view of that shown in FIG. 6A.

FIG. 6A is a perspective view and FIG. 6B is a plan view illustrating an intersecting waveguides 600, wherein the optical waveguides are manufactured within the same plan, the cores intersecting with one another. Here a first waveguide core 612A intersects with second waveguide core 612B at an intersecting angle 613, the intersecting angle preferably greater than about 45 degrees and optimally orthogonal. The intersection of the waveguides preferably has intersection refractive gradient 615 with greatest refractive index at the center of the intersecting waveguide, thereby acting as a tapered waveguide. Refractive gradient 615 causes optical signals 614, propagating through waveguide 612A to undergo modal confinement, preventing interaction with optical waveguide 612B and avoiding crosstalk. As before, aforementioned methods of optical waveguide manufacture can be used to manufacture the intersecting waveguides.

Figure 7A:
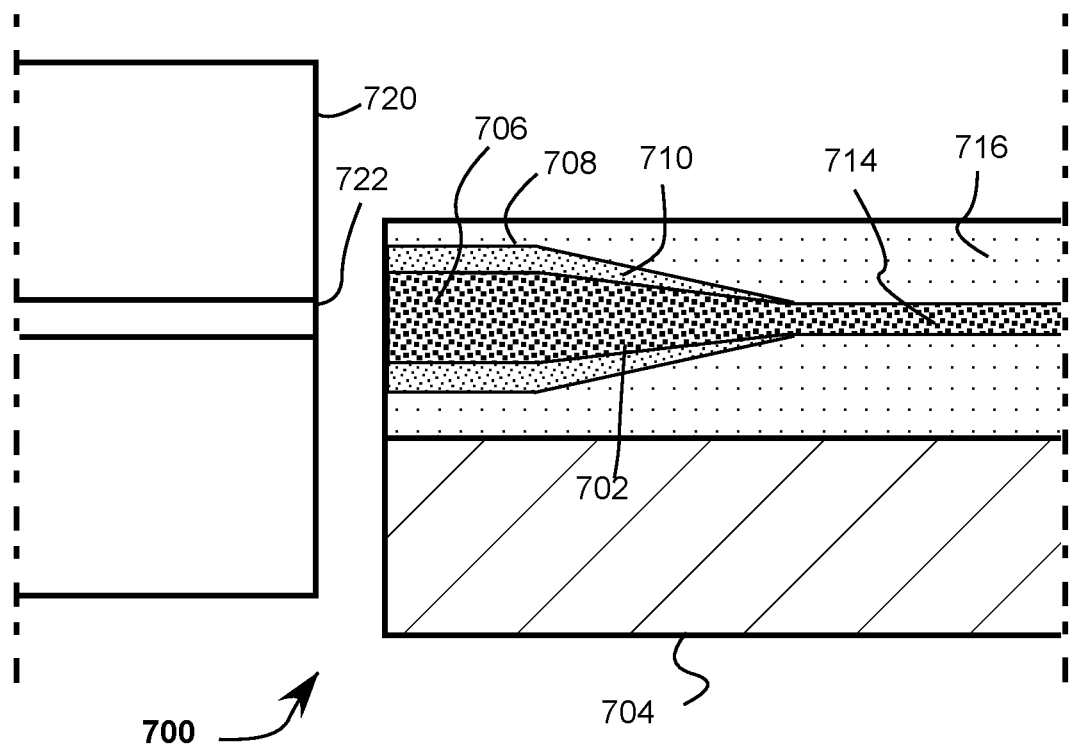
FIG. 7A is a cross-section view of a GRIN tapered optocoupler.

FIG. 7A is a cross-section view of a GRIN tapered optocoupler 700. An optocoupler 702 is on a PCB board 704. Optocoupler 702 has refractive gradient represented here by with a high refractive index area 706 and a lower refractive index 708. At a tapered region 710, the optocoupler transitions into an optical waveguide 712 with a core 714 and a cladding 716. Operationally, an optical fiber 720 couples into the PCB via the optocoupler. The optical fiber has a core 722, that is placed in proximity to the optocoupler. Here, while represented as two distinct areas, those skilled in the area will recognize that a continuous smooth gradient refractive profile can be made in accordance with the present disclosure.

Figure 7B:
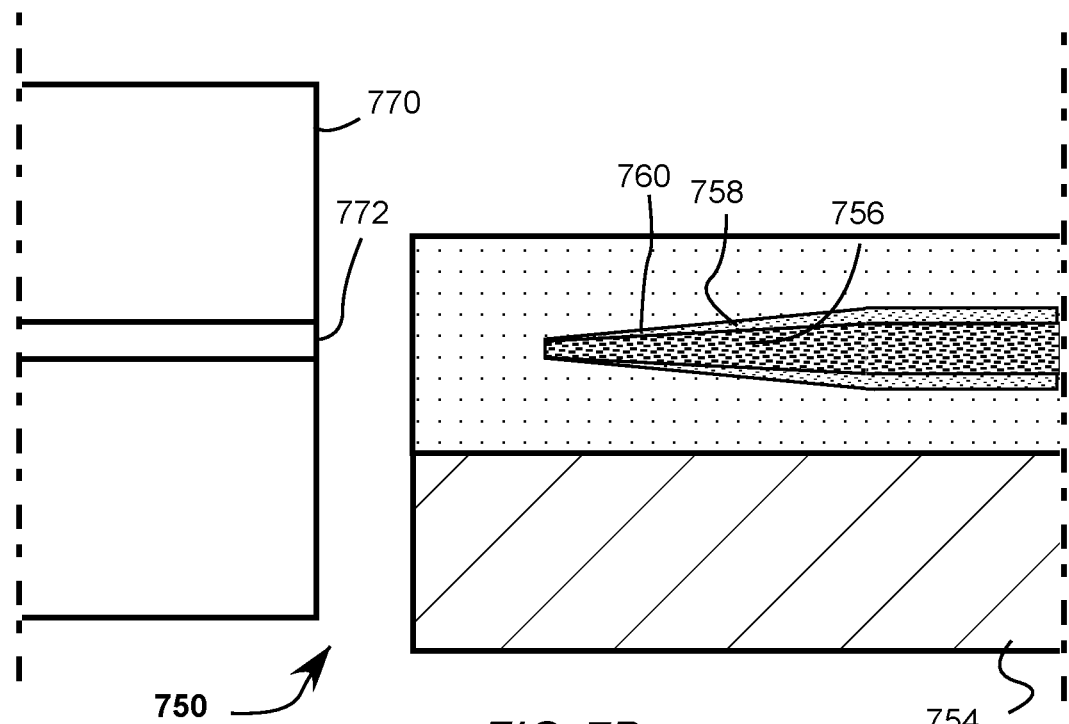
FIG. 7B is a cross-section view of an inverse GRIN tapered optocoupler

FIG. 7B is a cross-section view of an GRIN inverse tapered optocoupler 750. Similar to that shown in FIG. 7A, GRIN inverse tapered optocoupler 750 in on a PCB 754 and has a refractive gradient represented here by with a high refractive index area 756 and a lower refractive index 758. In contrast, optocoupler 750 has a tapered region 760 that transitions into a larger GRIN optical waveguide. Operationally, an optical fiber 770 couples into the PCB via the optocoupler. The optical fiber has a core 772, that is placed in proximity to the optocoupler.

Figure 7C:
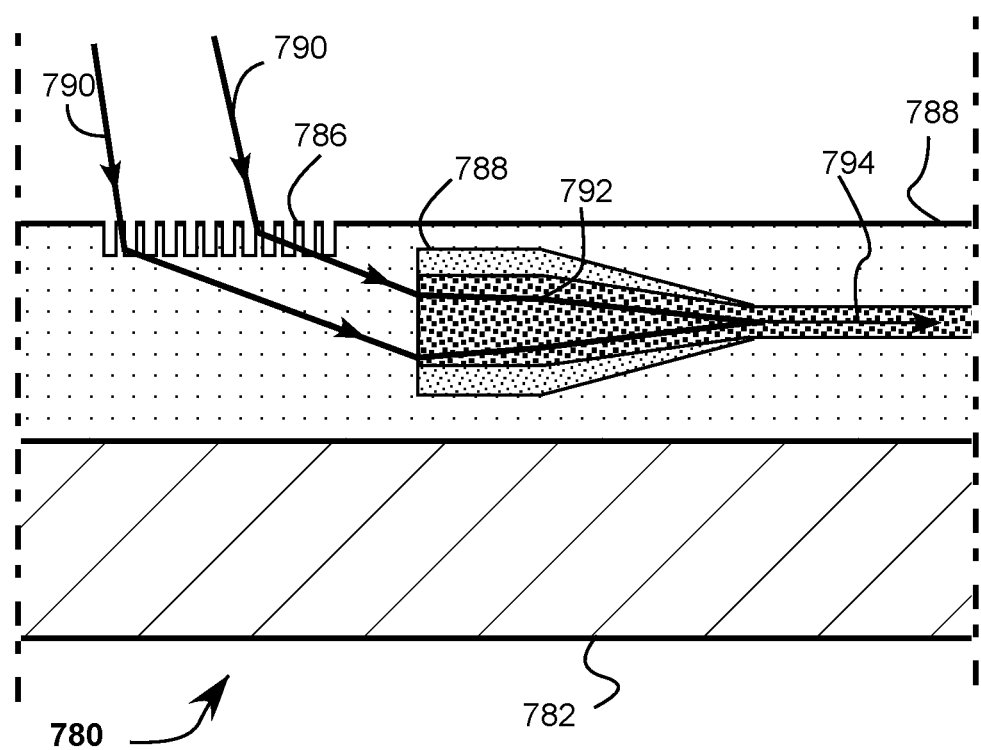
FIG. 7C is a cross-section view of a surface imprinted grating optocoupler.

FIG. 7C is a cross-section view of a surface imprinted grating optocoupler 780. Here, an optocoupler is formed on a PCB 782 via imprinting. A diffractive grating 786 is imprinted in a cladding material 788 directing coherent light 790 into a tapered GRIN region 792. Similar to the that shown in FIG. 7A, the tapered GRIN region directs the light to a core 794. A similar diffractive grating could be implemented with the inverse tapered GRIN optocoupler as shown in FIG. 7B.

Figure 8:
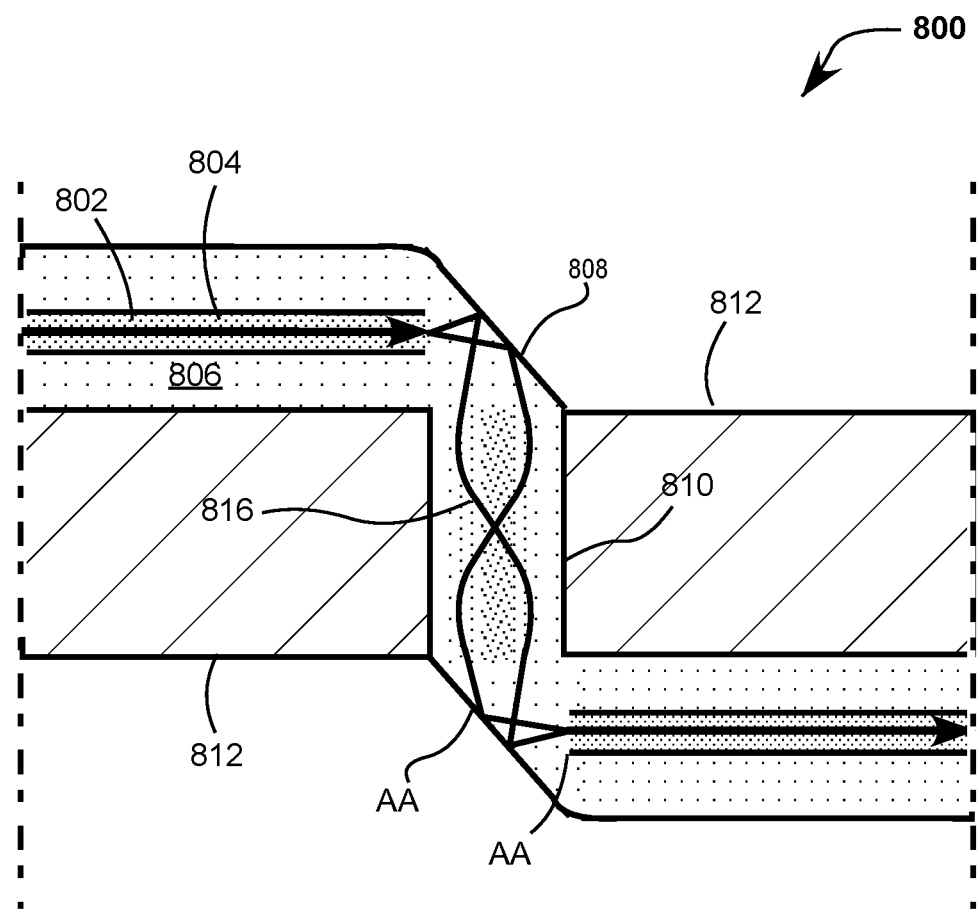
FIG. 8 is a cross-section view of a thru-PCB nanocomposite GRIN optical interconnect.

FIG. 8 is a cross-section view of a thru-PCB nanocomposite GRIN optical interconnect 800. This is non-limiting example provides a method of propagating light through layers of a PCB board. Explained operationally, a light ray 802, representing a beam of light, propagates through an optical waveguide core 804 confined to a cladding 806. The light ray reflects off an first angled surface 808 via total internal reflection. The light is reflected through a thru-hole 810 of a PCB layer 812. The thru-hole has a GRIN profile 816 that confines the light. The light ray then reflects off a second angled surface via total internal reflection and is directed to a second optical waveguide core 822, confined by a cladding 826.

Figure 9A:
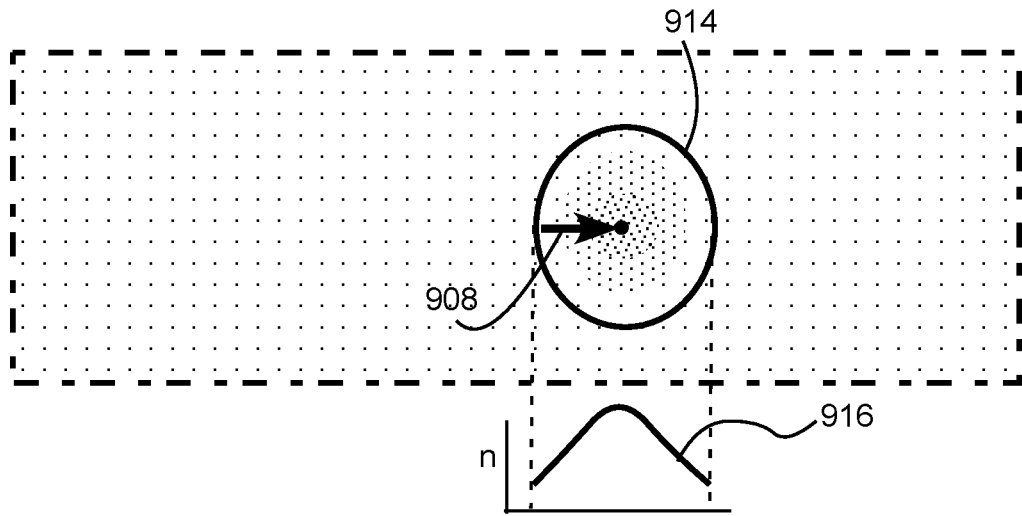
FIG. 9A is a plan view of a free-space optical interconnect.
Figure 9B:
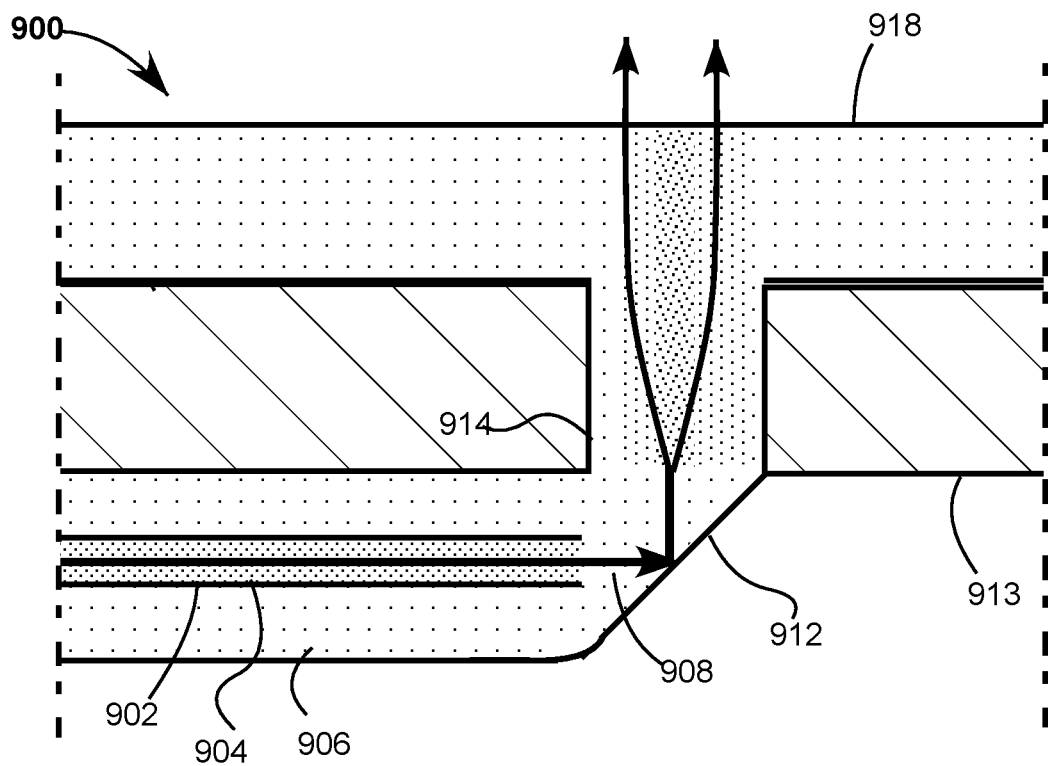
FIG. 9B is a cross-section view of that shown in FIG. 9A

FIG. 9A and FIG. 9B illustrate a plan view and a cross section view of a free-space optical interconnect 900. An optical waveguide 902 has a core 904 and a cladding 906. A light ray 908 propagates along the optical waveguide to and reflects off an angled surface 912 via total internal reflection. A PCB layer 913 has a thru-hole 914 has a gradient refractive profile 916 that collimates the light ray. The collimated light ray exits a cladding surface layer 918.

Figure 9C:
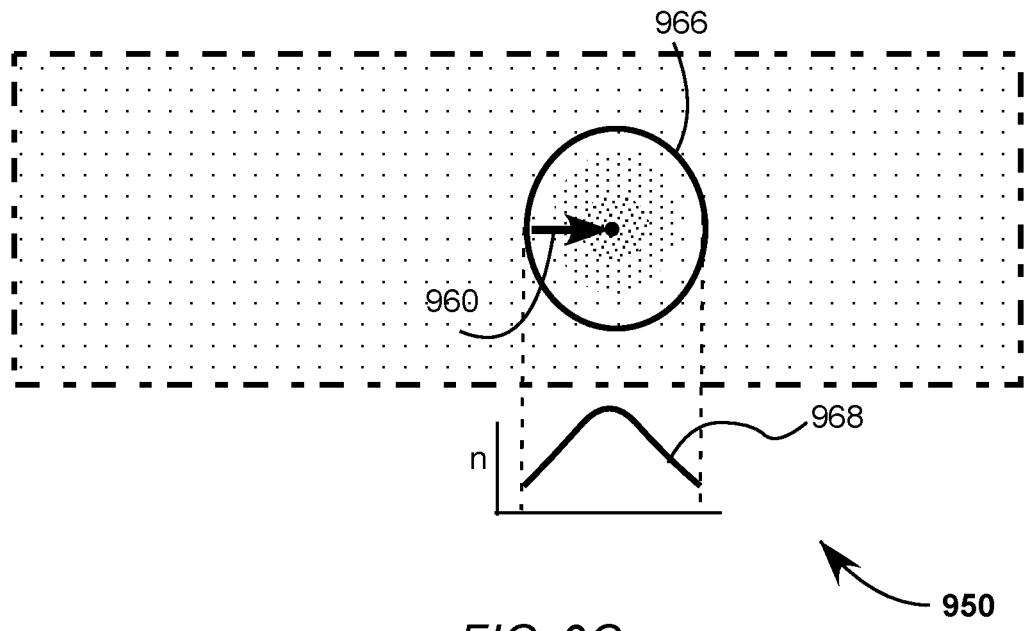
FIG. 9C is a plan view of a pickoff mirror free-space optical interconnect.
Figure 9D:
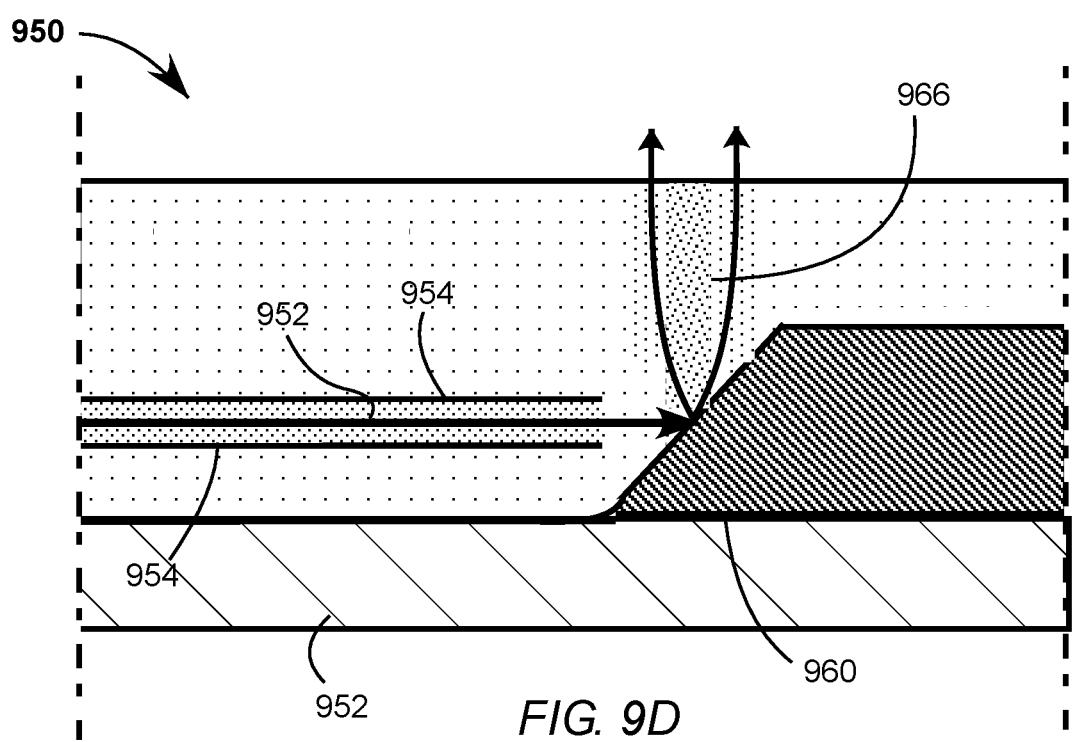
FIG. 9D is a cross-section view of that seen in FIG. 9C.

FIGS. 9C and 10D illustrate a pickoff mirror free-space optical interconnect 950. Here, a PCB layer 952 has an optical waveguide 954. Optical waveguide 954 has an optical core 956 and cladding layer 958. A light ray 960 propagates to a pickoff mirror 962. On exiting the confinement of the waveguide and reflection from the pickoff mirror, the light ray diverges. A GRIN lens 966 is integrated into the cladding area above the pickoff mirror. The GRIN lens has a parabolic refractive index profile 968 which collimates the light as it exits into free space.

Figure 10A:
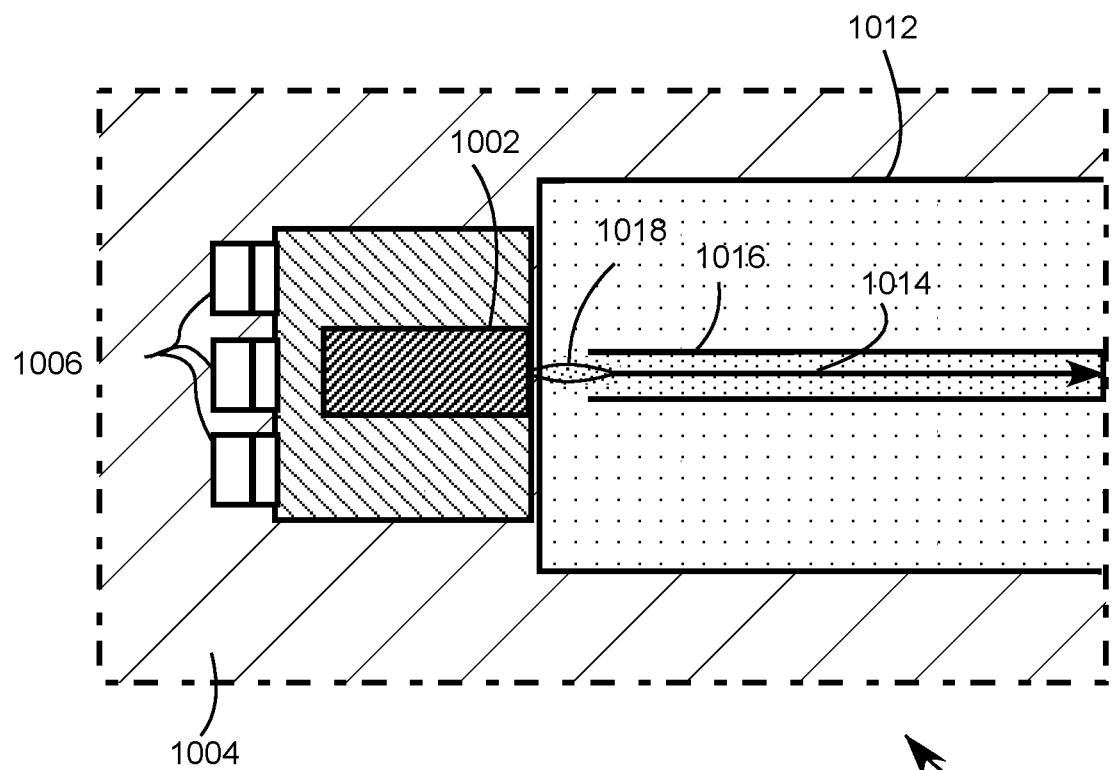
FIG. 10A is a plan view illustrating a surface mounted laser diode.
Figure 10B:
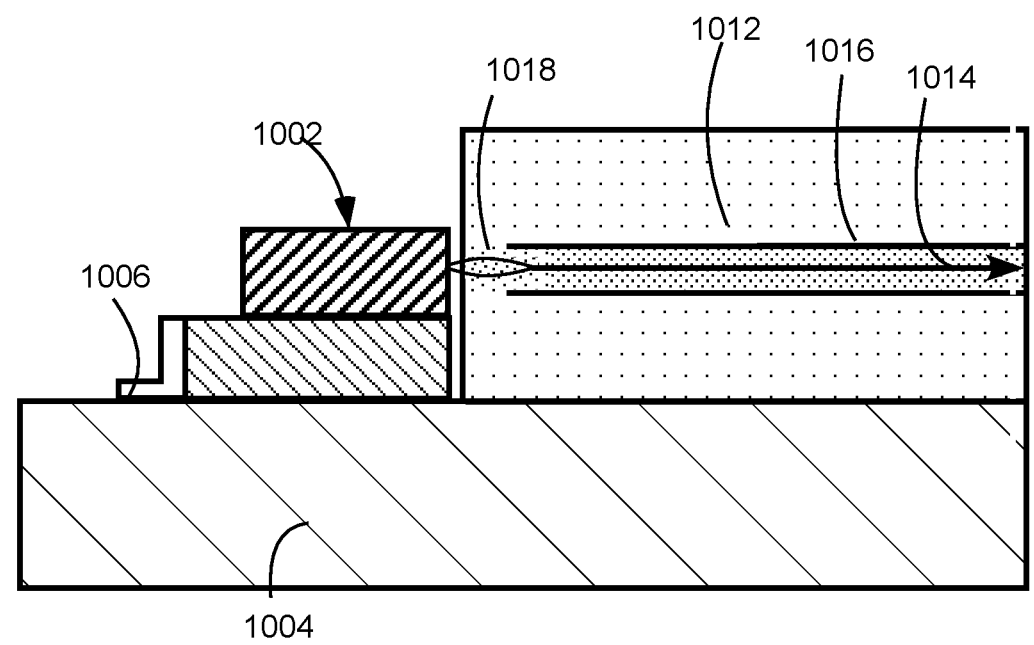
FIG. 10B is a cross-section view illustrating that shown in FIG. 10A

FIGS. 10A and 10B illustrate an edge-emitting LD optocoupler 1000. A laser diode 1002 is mounted to a PCB layer 1004 via a series of leads 1006. Although in some embodiments the laser diode transmits external signals, here, the laser diode 1002 is optically interconnected to a waveguide 1010 on the same PCB 1004. Waveguide 1012 has a core 1014 and a cladding 1016. Laser diode 1002 can be butt coupled to the optical waveguide or, as shown, a small GRIN coupling lens 1018 can be implemented to improve coupling efficiency.

From the description of the present invention provided herein one skilled in the art can implement the method of manufacture in accordance with the present invention. While the present invention has been described in terms of particular examples, others can be implemented without departing from the invention. In summary, the present invention is described above in terms of particular embodiments. The invention, however, is not limited to the embodiments described and depicted herein. Rather, the invention is limited only by the claims appended hereto.

What is claimed is:

1. An apparatus with integrated optical waveguides, the apparatus comprising:
   a plurality of layers, wherein a conductive pathway is patterned on a surface of at least one of the plurality of layers, the plurality of layers laminated together;
   a plurality of nanocomposite-inks, the nanocomposite-inks comprising a nanofiller dispersed in an organic matrix, each of the plurality of nanocomposite-inks having optical dispersion different from the other nanocomposite-inks;
   an optical waveguide, the optical waveguide formed on the surface of, or within, at least one of the plurality of layers, the nanocomposite-ink forming the optical waveguide; and
   an optical component, the optical component on the surface of, or within, at least one of the plurality of layers, the nanocomposite-ink forming the optical component, wherein the optical component has, at least in part, a gradient refractive profile.

2. The apparatus of claim 1, wherein the optical waveguide couples to a photonic detector.

3. The apparatus of claim 1, wherein the optical waveguide couples to a photonic transmitter.

4. The apparatus of claim 1, wherein the optical waveguide transmits at a wavelength between 800-nm and 2100-nm.

5. The apparatus of claim 1, wherein the optical waveguide couples to an optical interconnect.

6. The apparatus of claim 5, wherein the optical interconnect is oriented orthogonal to the plane of the plurality of layers.

7. The apparatus of claim 5, further comprising a conductive nanocomposite-ink on, or within, at least one of the plurality of layers, the conductive-ink processed in order to make the conductive nanocomposite-ink in a conductive solid.

8. The apparatus of claim 7, wherein the conductive nanocomposite-ink forms part of an electro-optic modulator.

9. The apparatus of claim 7, wherein the conductive nanocomposite-ink interconnects patterned with the conductive pathways.

10. The method of claim 1, wherein the optical component comprises of a coupling lens, a TIR surface, an optocoupler, or combination thereof.

11. The method of claim 1, wherein the optical waveguide terminates at a reflective surface.

12. The method of claim 1, wherein the nanofillers include core, core-shell, core-shell, and core-shell-ligand architectures.

13. A method of manufacturing a printed circuit board, the method comprising the steps of:
inkjet depositing and selectively curing a first nanocomposite-ink on a layer of a printed circuit board;
inkjet depositing and selectively curing a second nanocomposite-ink, the second nanocomposite-ink having different optical dispersion than the first nanocomposite-ink;
repeating deposition of the first nanocomposite-ink and the second nanocomposite-ink, wherein the deposition of the first and the second nanocomposite-ink form an optical waveguide on the printed circuit board layer, the waveguide having a gradient refractive index.

14. The method of claim 13, wherein the deposition of the first and the second nanocomposite-ink further includes forming an optical-element with a gradient refractive index.

15. The method of claim 1, wherein the layer of the printed circuit board is laminated to another printed circuit layer before nanocomposite-ink deposition.

16. The method of claim 1, wherein the optical waveguide's core is formed by nanoimprinting.

17. The method of claim 1, wherein the optical waveguide's core is formed by a sidewall, the sidewall formed by the nanocomposite-ink.

18. The method of claim 1, wherein the optical waveguide terminates at a total-internal-reflection (TIR) interface.

19. The method of claim 1, further comprising the step of depositing and curing a conductive nanocomposite-ink, the deposition of the conductive-ink providing electrically conductive pathways.

20. The method of claim 1, further comprising the step of depositing electro-optic material exhibiting second-order nonlinear properties.

* * * * *